United States Patent [19]

Sano et al.

[11] Patent Number: 4,820,997
[45] Date of Patent: Apr. 11, 1989

[54] DIFFERENTIAL AMPLIFIER CIRCUIT

[75] Inventors: Yuji Sano, Yokohama; Michitaka Osawa, Fujisawa; Masahide Kawai, Yokohama, all of Japan

[73] Assignee: Hitachi, Ltd., Tokyo, Japan

[21] Appl. No.: 20,884

[22] Filed: Mar. 2, 1987

[30] Foreign Application Priority Data

Mar. 3, 1986 [JP] Japan .................. 61-43964

[51] Int. Cl.$^4$ .......................... H03F 1/32; H03F 3/45
[52] U.S. Cl. .................................... 330/252; 330/149
[58] Field of Search ............... 330/149, 252, 261, 311

[56] References Cited

U.S. PATENT DOCUMENTS

| | | | |
|---|---|---|---|
| 3,678,404 | 7/1972 | Blom et al. | 330/310 |
| 3,689,752 | 9/1972 | Gilbert | 330/252 X |
| 4,081,758 | 3/1978 | Steckler | 330/252 |
| 4,390,848 | 6/1983 | Blauschild | 330/252 X |

*Primary Examiner*—James B. Mullins
*Attorney, Agent, or Firm*—Antonelli, Terry & Wands

[57] ABSTRACT

A differential amplifier circuit including not only first and second transistors whose emitters are coupled together through a resistor to form a differential transistor pair, but also first and second distortion-correcting transistors, is disclosed. In this circuit, the base terminal of the first transistor is connected to the emitter terminal of the first distortion-correcting transistor, the base terminal of the second transistor is connected to the emitter terminal of the second distortion-correcting transistor, the emitter terminals of the first and second distortion-correcting transistors are connected to a current source of the current control type, and a ratio of the current flowing through the first distortion-correcting transistor to the current flowing through the second distortion-correcting transistor is made equal to a ratio of the emitter current of the second transistor to the emitter current of the first transistor, to cancel the non-linear distortion due to the base-to-emitter voltages of the first and second transistors by the non-linear distortion due to the base-to-emitter voltages of the first and second distortion-correcting transistors, thereby eliminating non-linear distortion from the output of the differential amplifier circuit.

7 Claims, 3 Drawing Sheets

DIFFERENTIAL AMPLIFIER CIRCUIT

BACKGROUND OF THE INVENTION

The present invention relates to a differential amplifier, and, more particularly, to a differential amplifier, in which signal distortion is corrected.

The main signal distortion generated by an amplifier is non-linear distortion, which is based upon the fact that a voltage developed across a junction part of a semiconductor element varies with a current flowing through the junction pat. A circuit for solving this problem is disclosed in U.S. Pat. No. 4,146,844. In this circuit, an error signal compensating circuit is connected to a differential amplifier to correct an error component which is generated by the differential amplifier. However, individual semiconductor elements included in the error signal compensating circuit also generate non-linear distortion. Accordingly, these prior techniques have not been successful in completely eliminating the error component generated by the above circuit.

SUMMARY OF THE INVENTION

It is an object of the present invention to provide a transconductance amplifier circuit which, in the whole dynamic range, can amplify an input signal without being affected by the non-linear distortion due to the base-to-emitter voltage of an amplifying element.

In an amplifier circuit according to the present invention, a main differential amplifier having base-to-emitter distortion is connected to a distortion-correcting amplifier having base-to-emitter distortion so that the base-to-emitter distortion of the main differential amplifier and that of the distortion-correcting amplifier cancel each other. That is, an input signal is amplified by first and second transistors of the distortion-correcting amplifier and then amplified by first and second transistors of the main differential amplifier, and a ratio of the emitter current of the first transistor 21 of the distortion-correcting amplifier to the emitter current of the second transistor 22 thereof (e.g. see FIG. 1) is substantially equal to a ratio of the emitter current of the second transistor 2 of the main differential amplifier to the emitter current of the first transistor 1 thereof (for example, the former ratio is made equal to the latter ratio). As is well known, the base-to-emitter voltage of a transistor varies in general with the emitter current thereof, that is, is proportional to the natural logarithm of the emitter current. Accordingly in the above amplifier circuit, the difference between the base-to-emitter voltages of the first and second transistors of the main differential amplifier is canceled by the difference between the base-to-emitter voltages of the first and second transistors of the distortion correcting amplifier, and thus has no effect on an output signal.

DESCRIPTION OF THE PREFERRED EMBODIMENTS

Prior to the explanation of embodiments of the present invention, a problem which a fundamental differential amplifier encounters will be described with reference to FIG. 2.

Figure 2:
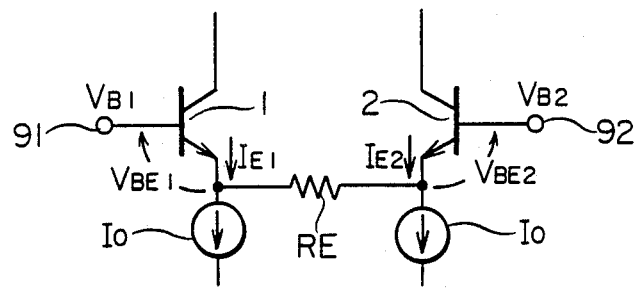
FIG. 2 is a conventional circuit diagram showing a fundamental differential amplifier, which is used as part of the embodiment of FIG. 1.

Referring to FIG. 2, a fundamental differential amplifier includes transistors 1 and 2 for forming a differential transistor pair, current sources $I_O$ connected to the emitters of the transistors 1 and 2, and a resistor $R_E$ connected between the emitters of the transistors 1 and 2. The base-to-emitter voltages $V_{BE1}$ and $V_{BE2}$ of the transistors 1 and 2 increase with increasing emitter currents thereof. A differential input signal $V_{B1} - V_{B2}$ applied between input terminals 91 and 92 is applied across the resistor $R_E$ through the base-emitter junctions of the transistors 1 and 2, and thus a current flows through the resistor $R_E$. A load current obtained from the collectors of the transistors 1 and 2 corresponds to the current flowing through the resister $R_E$. The voltage applied across the resistor $R_E$ is given by $(V_{B1} - V_{BE1}) - (V_{B2} - V_{BE2})$. When the difference between the base-to-emitter voltages $V_{BE1}$ and $V_{BE2}$ increases to such an extent as not to be negligible, the output of the differential amplifier varies non-linearly with the input thereof. The above explanation will be expressed below by mathematical formulae.

When a saturation current at a junction is expressed by $I_S$ and a thermal potential (corresponding to thermal energy of carrier) is expressed by $V_T$, the emitter currents $I_{E1}$ and $I_{E2}$ of the transistors 1 and 2 are given by the following equations:

$$I_{E1} = I_{S1} \exp \frac{V_{BE1}}{V_T} \tag{1}$$

$$I_{E2} = I_{S2} \exp \frac{V_{BE2}}{V_T} \tag{2}$$

From the equations (1) and (2), we can obtain the following equations:

$$V_{BE1} = V_T \ln \frac{I_{E1}}{I_{S1}} \tag{1'}$$

$$V_{BE2} = V_T \ln \frac{I_{E2}}{I_{S2}} \tag{2'}$$

Here $V_T$ is a constant depending on the temperature of the transistor, and $I_{S1}$, $I_{S2}$ are constants depending on the temperature of the transistors.

In the circuit configuration of FIG. 2, we can obtain the following equations:

$$I_O = I_{E1} + \frac{(V_{B2} - V_{BE2}) - (V_{B1} - V_{BE1})}{R_E} \tag{3}$$

$$I_O = I_{E2} + \frac{(V_{B1} - V_{BE1}) - (V_{B2} - V_{BE2})}{R_E} \tag{4}$$

From the equations (1)', (2)', (3) and (4), we can obtain the following equation:

$$I_{E1} - I_{E2} = \frac{2}{R_E}\left((V_{B1} - V_{B2}) - V_T \ln \frac{I_{E1}I_{S2}}{I_{E2}I_{S1}}\right) \quad (5)$$

The transistors 1 and 2 are similar in characteristics, and hence the saturation current $I_{S1}$ is nearly equal to the saturation current $I_{S2}$. Thus, the equation (5) can be rewritten as follows:

$$I_{E1} - I_{E2} = \frac{2}{R_E}\left((V_{B1} - V_{B2}) - V_T \ln \frac{I_{E1}}{I_{E2}}\right) \quad (5)'$$

As is evident from the equation (5)', the differential amplifier of FIG. 2 generates non-linear distortion $$V_T \ln \frac{I_{E1}}{I_{E2}}.$$

When the emitter currents $I_{E1}$ and $I_{E2}$ are equal to each other, the non-linear distort $$V_T \ln \frac{I_{E1}}{I_{E2}}$$

becomes zero. This non-linear distortion increases as the difference between the emitter currents $I_{E1}$ and $I_{E2}$ becomes larger.

Now, explanation will be made of an embodiment of a differential amplifier circuit according to the present invention, with reference to FIG. 1.

Figure 1:
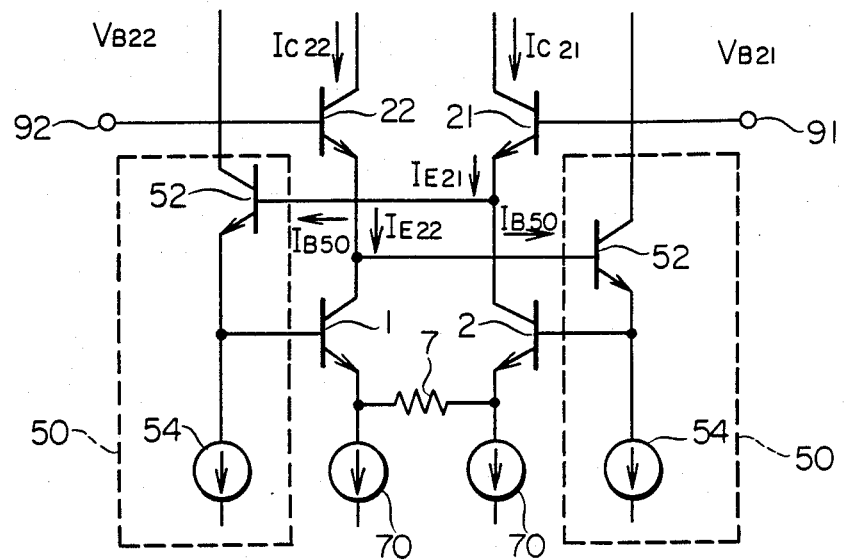
FIG. 1 is a circuit diagram showing an embodiment of a differential amplifier circuit according to the present invention.

In FIG. 1 which shows the embodiment, reference numerals 1 and 2 designate a pair of transistors for forming a main differential transistor pair, 21 and 22 another pair of transistors for correcting signal distortion, 50 a level shift circuit for shifting a signal level by a predetermined voltage, and 70 constant current sources required for differential amplification. In the present embodiment, the transistors 1 and 22 are connected in series, and the transistors 2 and 21 are connected in series. Further, as is apparent from FIG. 1, the equations (3) and (4) are modified as follows:

$$I_O = I_{E1} + \frac{(V_{B22} - V_{BE22} - V_{BE2}) - (V_{B21} - V_{BE21} - V_{BE1})}{R_E} \quad (6)$$

$$I_O = I_{E2} + \frac{(V_{B21} - V_{BE21} - V_{BE1}) - (V_{B22} - V_{BE22} - V_{BE2})}{R_E} \quad (7)$$

From the equations (6) and (7), we can obtain the following equation:

$$I_{E1} - I_{E2} = \quad (8)$$

$$\frac{2}{R_E}\{(V_{B21} - V_{B22}) + (V_{BE2} + V_{BE22} - V_{BE1} - V_{BE21})\}$$

The term $(V_{BE2}+V_{BE22}-V_{BE1}-V_{BE21})$ on the right-hand side of the equation (8) indicates the non-linear distortion due to the difference between the base-to-emitter voltages of a pair of transistors 1 and 2 and the difference between the base-to-emitter voltages of another pair of transistors 21 and 22. On the basis of the equations (1)' and (2)', the non-linear distortion can be rewritten as follows:

$$V_{BE2} + V_{BE22} - V_{BE1} - V_{BE21} = V_T \ln\left(\frac{I_{S1}I_{S21}I_{E2}I_{E22}}{I_{S2}I_{S22}I_{E1}I_{E21}}\right) \quad (9)$$

The transistors 1 and 2 are similar and the transistors 21 and 22 are similar in characteristics. That is, the saturation currents $I_{S1}$ and $I_{S2}$ are nearly equal to each other, and also the saturation currents $I_{S21}$ and $I_{S22}$ are nearly equal to each other. Thus, the equation (9) can be rewritten as follows:

$$V_{BE2} + V_{BE22} - V_{BE1} - V_{BE21} = V_T \ln\left(\frac{I_{E2}I_{E22}}{I_{E1}I_{E21}}\right) \quad (10)$$

A base current $I_{B50}$ shown in FIG. 1 is far smaller than each of the emitter currents $I_{E21}$ and $I_{E22}$. Hence, the emitter current $I_{E1}$ is nearly equal to the emitter current $I_{E22}$, and the emitter current $I_{E2}$ is nearly equal to the emitter current $I_{E21}$. That is, a ratio $I_{E2}/I_{E1}$ is equal to a ratio $I_{E21}/I_{E22}$. Thus, the non-linear distortion $$V_T \ln\left(\frac{I_{E2}I_{E22}}{I_{E1}I_{E21}}\right)$$

is equal to zero. In the present embodiment, the transistors 2 and 1 act as current control means for the transistors 21 and 22, respectively. Further, the level shift circuit 50 produces a predetermined voltage drop or rise, to apply an appropriate input voltage to each of the transistors 1 and 2. The level shift circuit 50 may have a circuit configuration other than that shown in FIG. 1, provided that the circuit configuration has a high input impedance so that the emitter currents $I_{E21}$ and $I_{E22}$ are not affected by the circuit configuration.

As has been explained in the above, the present embodiment can eliminate non-linear distortion from an amplified signal.

In the present embodiment, NPN transistors are used as the transistors 1, 2, 21 and 22. However, these transistors may be PNP transistors. In this case, the direction of current or voltage at ious circuit parts is reversed.

Figure 3:
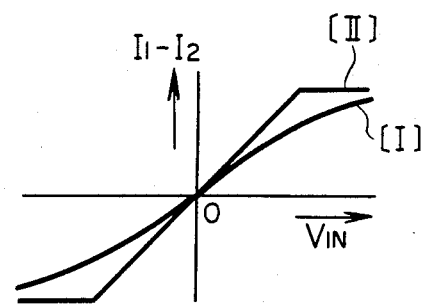
FIG. 3 is a graph showing input-output characteristics of a conventional differential amplifier and the embodiment of FIG. 1.

FIG. 3 shows input-output characteristics of amplifiers. In FIG. 3, a curve [I] indicates the input-output characteristic of a conventional differential amplifier circuit, and a curve [II] indicates the input-output characteristic of the present embodiment. As shown in FIG. 3, the present embodiment has a linear input-output characteristic, since the non-linear distortion $$V_T \ln\left(\frac{I_{E1}}{I_{E2}}\right)$$

is canceled. On the other hand, the conventional differential amplifier circuit has a non-linear input-output characteristic, because of the presence of the non-linear distortion $$V_T \ln\left(\frac{I_{E1}}{I_{E2}}\right).$$

Figure 4:
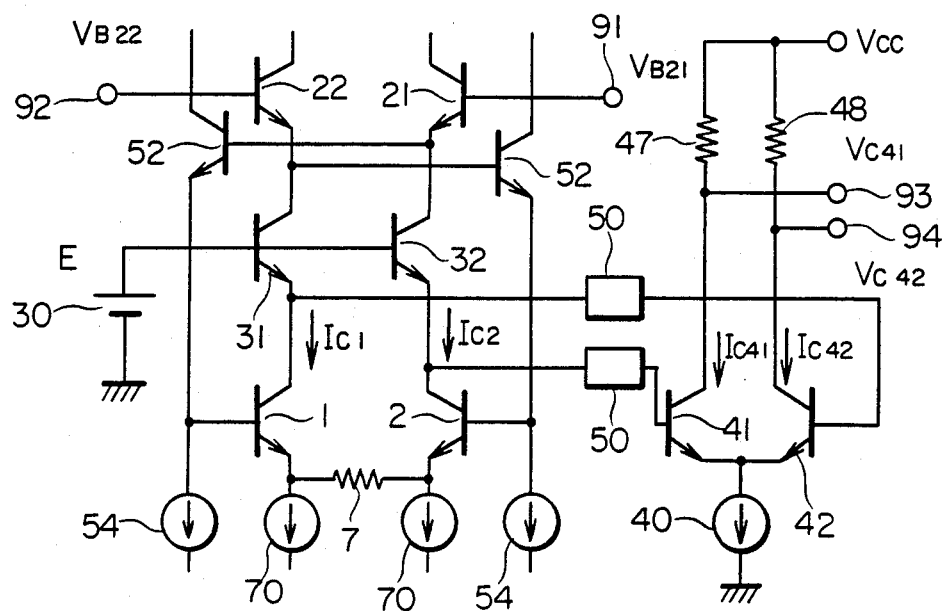
FIGS. 4 to 6 are circuit diagrams showing other embodiments of a differential amplifier circuit according to the present invention.

FIG. 4 shows another embodiment of a differential amplifier circuit according to the present invention. In the present embodiment, a logarithmic compression circuit and an output circuit for expanding a voltage which has been subjected to logarithmic compression, are provided between the main differential transistor pair and the distortion-correcting transistor pair. The base terminals of the transistors 31 and 32 for logarithmic compression are connected to a voltage source 30, to cause a current equal to the emitter current $I_{E1}$ to flow between the collector and emitter of the transistor 31, and to cause a current equal to the emitter current $I_{E2}$ to flow between the collector and emitter of the transistor 32. Thus, the base-to-emitter voltages $V_{BE31}$ and $V_{BE32}$ of the transistors 31 and 32 vary with the emitter currents $I_{E1}$ and $I_{E2}$, respectively, and we can obtain the following equation:

$$V_{BE31} - V_{BE32} = V_T \ln\left(\frac{I_{E1}}{I_{E2}}\right) \tag{11}$$

That is, a voltage proportional to the natural logarithm of a ratio of the emitter current $I_{E1}$ to the emitter current $I_{E2}$ is developed between emitter terminals of the transistors 31 and 32. This voltage is applied between the bases of output transistors 41 and 42, to be subjected to logarithmic expansion and to be converted into an output voltage. The above operation of the present embodiment will become more apparent from the following equations:

$$\frac{I_{C42}}{I_{C41}} = \frac{I_S \exp\left(\frac{V_{BE42}}{V_T}\right)}{I_S \exp\left(\frac{V_{BE41}}{V_T}\right)} = \exp\left(\frac{V_{BE42} - V_{BE41}}{V_T}\right) = \tag{12}$$

$$\exp\left(\frac{V_{B42} - V_{B41}}{V_T}\right)$$

$$V_{B41} - V_{B42} = (E - V_{BE32}) - (E - V_{BE31}) = V_{BE31} - V_{BE32} \tag{13}$$

$$V_{BE31} - V_{BE32} = V_T \ln\left(\frac{I_{C1}}{I_{C2}}\right) \tag{14}$$

From the equations (12), (13) and (14), we can obtain the following equation:

$$\frac{I_{C41}}{I_{C42}} = \exp\left(\frac{V_T \ln\left(\frac{I_{C2}}{I_{C1}}\right)}{V_T}\right) = \frac{I_{C2}}{I_{C1}} \tag{15}$$

As shown in FIG. 4, the output circuit of the present embodiment is connected between a source voltage $V_{CC}$ and ground, and is made up of the transistors 41 and 42, resistors 47 and 48, and a current source 40. Accordingly, the dynamic range of output signal is nearly equal to the source voltage $V_{CC}$.

Figure 5:
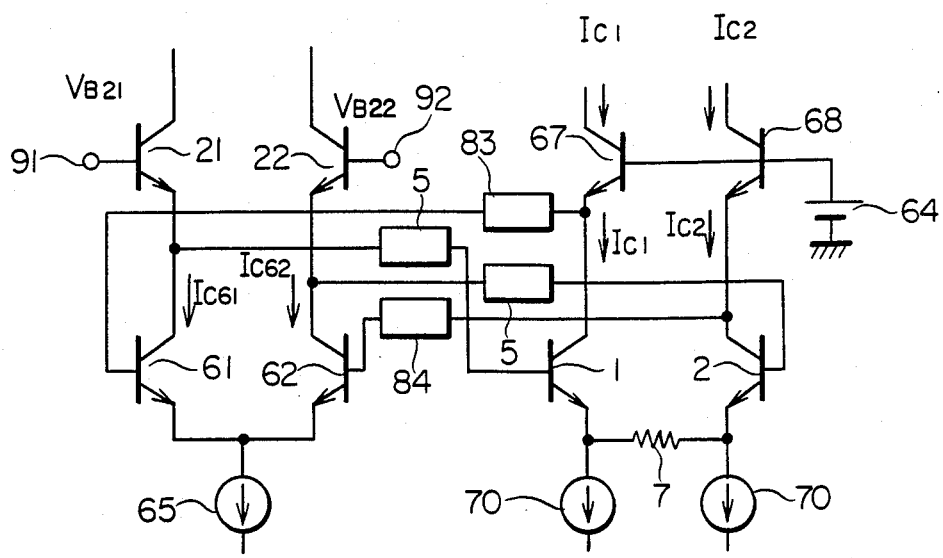

FIG. 5 shows a further embodiment of a differential amplifier circuit according to the present invention. The present embodiment is intended to improve the dynamic range of input signal. In the embodiments of FIGS. 1 and 4, the transistors 1 and 2 for forming a main differential transistor pair are connected in series with the distortion-correcting transistors 22 and 21, is less than $\frac{1}{2}V_{CC}$. While, in the present embodiment, the transistors 1 and 2 for forming the main differential transistor pair are not connected in series with the distortion-correcting transistors 21 and 22, and hence the dynamic range of input signal is nearly equal to $V_{CC}$. In the present embodiment, a current source of the current control type is made up of a current value detecting circuit including circuit elements 64, 67 and 68 for detecting a ratio of a collector current $I_{C1}$ to a collector current $I_{C2}$, and a current source including circuit elements 61, 62 and 65 for controlling the currents of the distortion-correcting transistors 21 and 22. A current ratio $I_{C62}/I_{C61}$ is substantially equal to a current ratio $I_{C1}/I_{C2}$, and the collector currents $I_{C62}$ and $I_{C61}$ are equal to the emitter currents $I_{E22}$ and $I_{E21}$, respectively. Thus, a differential output current $(I_{C1} - I_{C2})$ proportional to a differential input voltage $(V_{B21} - V_{B22})$ is delivered from the present embodiment.

Figure 6:
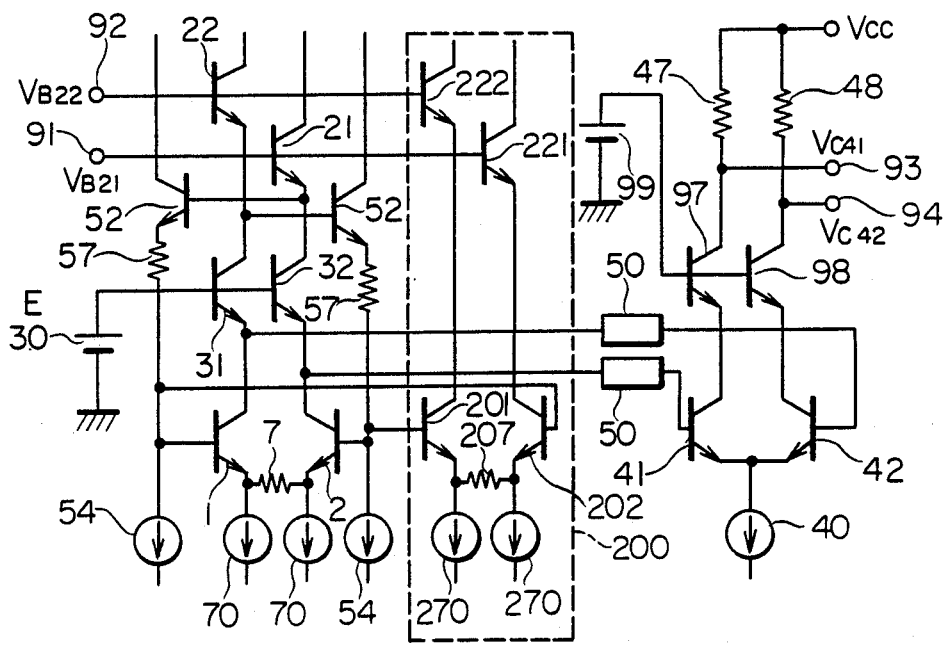

FIG. 6 shows still another embodiment of a differential amplifier circuit according to the present invention. In the embodiments of FIGS. 1, 4 and 5, the input impedance of the distortion-correcting transistors 21 and 22 sometimes contains a negative resistance component. At this time, an unstable operation such as oscillation due to positive feedback will be performed, if the impedance of input signal source is not made low. The unstable operation can be prevented by the present embodiment.

Referring to FIG. 6, stabilizing transistors 221 and 222 are connected in parallel with the distortion-correcting transistors 21 and 22, respectively, and transistors 202 and 201 for forming a differential transistor pair are connected in parallel with the transistors 1 and 2 for forming the main differential transistor pair, respectively. Further, transistors 97 and 98 are provided for forming a cascade amplifier. The transistors 21, 22, 221 and 222 are similar in characteristics, and also the transistors 1, 2, 201 and 202 are similar in characteristics. Further, resistors 7 and 207 have the same resistance, and current sources 70 and 270 are equal in construction. Thus, as can be seen from FIG. 6, $I_{C1} = I_{C202}$, $I_{C2} = I_{C201}$, $I_{E21} = I_{E222}$, and $I_{E22} = I_{E221}$. Accordingly, the negative resistance components at the transistors 21 and 22 are canceled by the transistors 222 and 221 having similar negative resistance components, respectively. Thus, according to the present embodiment, the negative resistance component of input impedance is eliminated, and the non-linear signal distortion is also eliminated.

We claim:

1. A differential amplifier arrangement comprising:

first and second input terminals between which a signal source is connected;

a differential amplifier circuit having first and second transistors, each having collector, base and emitter electrodes, said emitters of said first and second transistors being connected together, wherein an output voltage is derived from at least one of said collectors of said first and second transistors;

a third transistor having a base electrode connected to said first input terminal and an emitter electrode connected to said base electrode of said second transistor;

a fourth transistor having a base electrode connected to said second input terminal and an emitter electrode connected to said base electrode of said first transistor; and current supply means having first and second current input terminals connected to said collector electrodes of said first and second transistors, respectively, and first and second current output terminals connected to said emitter electrodes of said third and fourth transistors, respectively, for producing output currents at said first and second current output terminals in response to in put currents at said first and second current input terminals so that a ratio of said output currents at said first and second current output terminals is equal to a ratio of said input currents at said first and second current input terminals.

2. A differential amplifier arrangement according to claim 1, wherein said currently supply means comprises fifth and sixth transistors whose emitters are connected to said first and second current input terminals, respectively, and whose bases are connected to a reference voltage, and seventh and eight transistors whose collectors are connected to said first and second current output terminals, respectively, whose bases are connected to said second and first current input terminals, respectively, and whose emitters are connected together.

3. A differential amplifier arrangement comprising:
first and second input terminals between which is signal source is connected;
a differential amplifier circuit having first and second transistors, each having collector, base and emitter electrodes, said emitters of said first and second transistors being connected together;
a third transistor having a base electrode connected to said first input terminal and an emitter electrode connected to said base electrode of said first transistor;
a fourth transistor having a base electrode connected to said second input terminal and an emitter electrode connected to said base electrode of said second transistor; and
current supply means having first and second current input terminals connected to said collector electrodes of said second and first transistors, respectively, and first and second current output terminals connected to said emitter electrodes of said third and fourth transistors, respectively, for producing output currents from said current supply means at said first and second current output terminals in response to input currents at said first and second current input terminals so that a ratio of said output currents at said first and second current output terminals is equal to a ratio of said input currents at said first and second current input terminals, wherein said current supply means further includes third and fourth current output terminals for producing output currents from said current supply means at said third and fourth current output terminals in response to input currents at said first and second current input terminals so that a ratio of said output currents at said third and fourth current output terminals is equal to a ratio of said input currents at said first and second current input terminals, wherein an output current is derived from at least one of said third and fourth current output terminals;

4. A differential amplifier arrangement according to claim 3, further comprising:
a fifth transistor having a base electrode connected to said base electrode of said first transistor; and emitter and collector electrodes;
a sixth transistor having a base electrode connected to said base electrode of said second transistor, and emitter and collector electrodes, said emitter electrodes of said fifth and sixth transistors being connected together;
a seventh transistor having a base electrode connected to said first input terminals and an emitter electrode connected to said collector electrode of said fifth transistor; and
an eighth transistor having a base electrode connected to said second input terminal and an emitter electrode connected to said collector electrode of said sixth transistor.

* * * * *